United States Patent
Watabe et al.

(10) Patent No.: US 9,871,156 B2
(45) Date of Patent: Jan. 16, 2018

(54) SOLAR CELL AND METHOD OF MANUFACTURING THE SAME

(71) Applicant: SHIN-ETSU CHEMICAL CO., LTD., Tokyo (JP)

(72) Inventors: Takenori Watabe, Annaka (JP); Hiroyuki Otsuka, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 43 days.

(21) Appl. No.: 13/753,974

(22) Filed: Jan. 30, 2013

(65) Prior Publication Data

US 2013/0206229 A1 Aug. 15, 2013

(30) Foreign Application Priority Data

Feb. 10, 2012 (JP) .................................. 2012-027297

(51) Int. Cl.
| | |
|---|---|
| *H01L 31/0525* | (2014.01) |
| *H01L 31/052* | (2014.01) |
| *H01L 31/0236* | (2006.01) |
| *H01L 31/068* | (2012.01) |
| *H01L 31/0216* | (2014.01) |
| *H01L 31/18* | (2006.01) |

(52) U.S. Cl.
CPC ...... *H01L 31/0527* (2013.01); *H01L 31/0236* (2013.01); *H01L 31/02167* (2013.01); *H01L 31/068* (2013.01); *H01L 31/1804* (2013.01); *Y02E 10/547* (2013.01); *Y02P 70/521* (2015.11)

(58) Field of Classification Search
CPC ....... H01L 31/022425; H01L 31/02168; H01L 31/02167; H01L 31/0527; H01L 31/0236; H01L 31/1804
See application file for complete search history.

(56) References Cited

U.S. PATENT DOCUMENTS

| | | | |
|---|---|---|---|
| 5,759,292 A | 6/1998 | Arimoto et al. | |
| 2004/0112426 A1* | 6/2004 | Hagino | ......................... 136/261 |
| 2007/0256733 A1* | 11/2007 | Karakida | .......... H01L 31/02242 |
| | | | 136/256 |
| 2010/0032012 A1 | 2/2010 | Isaka et al. | |
| 2010/0055822 A1 | 3/2010 | Weidman et al. | |

(Continued)

FOREIGN PATENT DOCUMENTS

| | | |
|---|---|---|
| CN | 102176474 A | 9/2011 |
| JP | 8-78709 A | 3/1996 |

(Continued)

OTHER PUBLICATIONS

Office Action dated Apr. 22, 2014, issued in Japanese Patent Application No. 2012-027297 (4 pages).

(Continued)

*Primary Examiner* — Julia Slutsker
(74) *Attorney, Agent, or Firm* — Westerman, Hattori, Daniels & Adrian, LLP (57) ABSTRACT

A method of manufacturing a solar cell, including the steps of: forming an SiNx film over a second principal surface of an n-type semiconductor substrate; forming a p-type diffusion layer over a first principal surface of the n-type semiconductor substrate after the SiNx film forming step; and forming an SiO$_2$ film or an aluminum oxide film over the p-type diffusion layer.

5 Claims, 5 Drawing Sheets

(56) References Cited

U.S. PATENT DOCUMENTS

| | | | |
|---|---|---|---|
| 2010/0224241 A1* | 9/2010 | Fukui | 136/256 |
| 2010/0267187 A1 | 10/2010 | Funakoshi | |
| 2010/0275983 A1 | 11/2010 | Kaes et al. | |
| 2010/0275984 A1* | 11/2010 | Kaes et al. | 136/255 |
| 2010/0275995 A1* | 11/2010 | Kaes | H01L 31/02242 136/258 |
| 2011/0155244 A1 | 6/2011 | Suh | |
| 2011/0237016 A1 | 9/2011 | Nishimoto | |
| 2011/0272020 A1* | 11/2011 | Biro | H01L 31/02245 136/256 |
| 2011/0318874 A1* | 12/2011 | Yamazaki | H01L 31/1804 438/98 |
| 2012/0174960 A1 | 7/2012 | Hashigami et al. | |
| 2012/0174978 A1* | 7/2012 | Ionkin et al. | 136/256 |
| 2013/0118571 A1* | 5/2013 | Shim | H01L 31/02363 136/256 |

FOREIGN PATENT DOCUMENTS

| | | |
|---|---|---|
| JP | 9-97916 A | 4/1997 |
| JP | 10-229211 A | 8/1998 |
| JP | 2002-270869 A | 9/2002 |
| JP | 2003-347567 A | 12/2003 |
| JP | 2004-6565 A | 1/2004 |
| JP | 2004-193350 A | 7/2004 |
| JP | 2005-327871 A | 11/2005 |
| JP | 2006-24757 A | 1/2006 |
| JP | 2008-311291 A | 12/2008 |
| WO | 2008/065918 A1 | 6/2008 |
| WO | 2011/033826 A1 | 3/2011 |

OTHER PUBLICATIONS

Australian Office Action dated Dec. 23, 2013, issued in corresponding Australian Patent Application No. 2013200622, (5 pages).

Japanese Office Action dated Oct. 7, 2014, issued in corresponding Japanese Application No. 2012-027297. (3 pages).

Search Report and Written Opinion dated Sep. 3, 2015, issued in counterpart Singaporean Application No. 2013008941, with English Translation. (9 pages).

Office Action dated Jan. 19, 2016, issued in counterpart Japanese Patent Application No. 2015-088999, with English translation. (7 pages).

Hofmann M. et al, "Industrial Type CZ Silicon Solar Cells with Screen-Printed Fine line Front Contacts and Passivated Rear Contacted by Laser Firing", The Complied State-of-the-Art of PV Solar Technology and Deployment: 23rd European Photovoltaic Solor Energy Conference, EU Conference, held in Valencia, Spain, 1-5, 2008, pp. 1704-1707.

Extended European Search Report dated Feb. 17, 2016, issued in European Patent Application No. 13153133.7, (9 pages).

Singaporean Search Report and Written Opinion dated Apr. 21, 2016, issued in counterpart Singaporean Patent Application No. 2013008941. (6 pages).

\* cited by examiner

SOLAR CELL AND METHOD OF MANUFACTURING THE SAME

CROSS-REFERENCE TO RELATED APPLICATION

This non-provisional application claims priority under 35 U.S.C. §119(a) on Patent Application No. 2012-027297 filed in Japan on Feb. 10, 2012, the entire contents of which are hereby incorporated by reference.

TECHNICAL FIELD

The present invention relates to a method of manufacturing a solar cell having passivation films respectively on both sides of a semiconductor substrate, and a solar cell manufactured by the method.

BACKGROUND ART

Crystalline solar cells in recent years have a pn junction type photodiode structure, generally provided with a p-type semiconductor on one side of a substrate and an n-type semiconductor on the other side. Most of such solar cells have had a configuration in which a diffusion layer of a conduction type (n type) opposite to the conduction type (p type) of the semiconductor substrate is provided on the light-receiving side, and an SiNx film as an anti-reflection film is formed on the diffusion layer.

Figure 1:
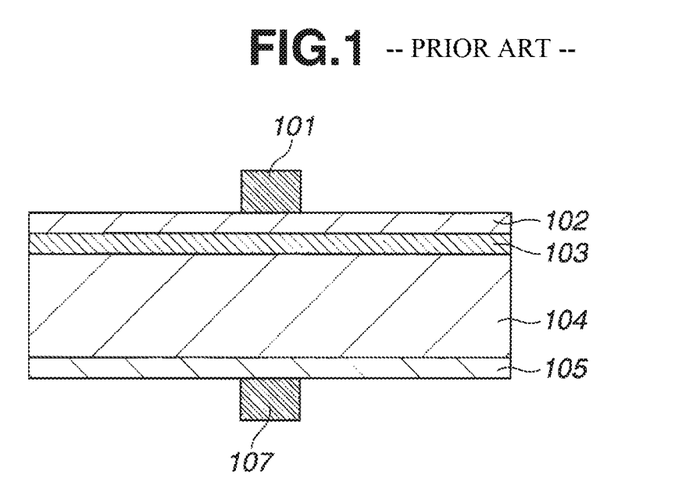
FIG. 1 is a sectional view showing a configuration example of a solar cell according to the related art.

FIG. 1 shows an example of the sectional configuration of a solar cell according to the related art in which a p-type semiconductor substrate is used.

As shown in FIG. 1, a thin diffusion layer 103 of a conduction type (n type) opposite to the conduction type of the p-type semiconductor substrate 104 is provided on the light-receiving surface side, and a silicon nitride (SiNx) film as an anti-reflection film 102 is formed thereon. In addition, electrodes 101 for collecting photo-excited carriers are provided on the anti-reflection film 102 at an interval of several millimeters (an interval of about 0.1 to 5 mm). On the other hand, current collection electrodes 107 are provided on the back side at an interval of several millimeters. As the material of these electrodes 101 and 107, silver (Ag) has often been used, from the viewpoint of conductivity. In addition, since the solar cells have to be fabricated at low cost, it has been a common practice to form the electrodes by applying a conductive metal-containing paste in the shape of electrodes by a printing method, followed by sintering at a high temperature.

In addition, those regions on the back side (p-type region) of the p-type semiconductor substrate 104 which are other than the regions of the electrodes 107 are protected (passivated) by a passivation film 105 composed of a silicon oxide ($SiO_2$) film. Such a structure wherein an $SiO_2$ film is formed as a passivation film on the back side is described in, for example, JP-A H09-097916.

Besides, an $SiO_2$ film is commonly formed by thermal oxidation. In this connection, JP-A H08-078709 discloses a method in which an $SiO_2$ film showing a good passivation effect is formed by a chemical treatment. Further, JP-A 2003-347567 and JP-A 2004-006565 each describe a method in which an $SiO_2$ film is formed by coating.

In addition, WO 2008/065918 discloses that an aluminum oxide film is also effective as a passivation film for p-type regions.

Besides, JP-A H10-229211 discloses a configuration in which a silicon nitride film is formed as a passivation film on a semiconductor substrate.

Meanwhile, in recent years, the use of n-type semiconductor substrates as means for enhancing the efficiency of crystalline silicon solar cells has been investigated (see, for example, JP-A 2005-327871). In the cases of using such an n-type semiconductor substrate, further enhancement of photoelectric conversion efficiency is being desired.

SUMMARY OF THE INVENTION

The present invention has been made in consideration of the above-mentioned circumstances. Accordingly, it is an object of the present invention to provide a method of manufacturing a solar cell by which an adequate passivation effect and a high photoelectric conversion efficiency can be obtained without increasing the number of manufacturing steps, and a solar cell manufactured by the solar cell manufacturing method.

In order to enhance the photoelectric conversion efficiency of crystalline silicon solar cells, passivation (inactivation) of surfaces on the face and back sides of a substrate is important. A passivation film for a solar cell substrate may be, for example, an SiNx film, an $SiO_2$ film, an aluminum oxide film or the like. Among these exemplary passivation films, the SiNx film is excellent in passivation properties for n-type semiconductors. The reason is considered to lie in that the SiNx film is positively charged.

Therefore, while a p-type diffusion layer is formed on the light-receiving surface side of a semiconductor substrate in the case where the semiconductor substrate is of the n type, formation thereon of an SiNx film like the passivation film 105 in FIG. 1 would not result in that the SiNx film functions sufficiently as a passivation film for the p-type diffusion layer.

On the other hand, an $SiO_2$ film and an aluminum oxide film are said to be effective in achieving passivation of p-type semiconductors.

Based on these findings, the present inventors made extensive and intensive investigations and, as a result, have made the present invention as follows.

Particularly, in order to attain the above object, according to the present invention, there is provided a method of manufacturing a solar cell and a solar cell manufactured by the method as follows.

[1] A method of manufacturing a solar cell, including the steps of:
 forming an SiNx film over a second principal surface of an n-type semiconductor substrate;
 forming a p-type diffusion layer over a first principal surface of the n-type semiconductor substrate after the SiNx film forming step; and
 forming over the p-type diffusion layer a passivation film composed of an $SiO_2$ film or an aluminum oxide film.

[2] The method according to [1], wherein the thickness of the SiNx film is at least 50 nm.

[3] The method according to [1] or [2] may further include a step of forming a texture on the first principal surface of the n-type semiconductor substrate, after the SiNx film forming step and before the diffusion layer forming step.

[4] The method according to any one of [1] to [3] may further include a step of forming an anti-reflection film over the passivation film.

[5] A method of manufacturing a solar cell, including the steps of:

forming an n-type diffusion layer over a second principal surface of a p-type semiconductor substrate;
  forming an SiNx film over the n-type diffusion layer; and
  forming over a first principal surface of the p-type semiconductor substrate a passivation film composed of an $SiO_2$ film or an aluminum oxide film after the SiNx film forming step.

[6] The method according to [5], wherein the thickness of the SiNx film is at least 50 nm.

[7] The method according to [5] or [6] may further include a step of forming a texture on the first principal surface of the p-type semiconductor substrate, after the SiNx film forming step and before the passivation film forming step.

[8] The method according to any one of [5] to [7] may further include a step of forming an anti-reflection film over the passivation film.

[9] A solar cell including:
  an SiNx film formed over a second principal surface of an n-type semiconductor substrate;
  a p-type diffusion layer formed over a first principal surface of the n-type semiconductor substrate; and
  a passivation film formed over the p-type diffusion layer and composed of an $SiO_2$ film or an aluminum oxide film,
  the solar cell being manufactured by the solar cell manufacturing method according to any one of [1] to [4].

[10] A solar cell including:
  an n-type diffusion layer formed over a second principal surface of a p-type semiconductor substrate;
  an SiNx film formed over the n-type diffusion layer; and
  a passivation film formed over a first principal surface of the p-type semiconductor substrate and composed of an $SiO_2$ film or an aluminum oxide film,
  the solar cell being manufactured by the solar cell manufacturing method according to any one of [5] to [8].

ADVANTAGEOUS EFFECTS OF THE INVENTION

According to the method of manufacturing a solar cell of the present invention, the SiNx film, which finally becomes the passivation film, serves as a diffusion mask concerning the formation of the p-type diffusion layer in the manufacturing process. Furthermore, the SiNx film serves as an oxidation mask concerning the formation of the $SiO_2$ film or aluminum oxide film. Therefore, it is possible to manufacture a solar cell having appropriate passivation films respectively on the face and back sides of a substrate, without need for additional especial steps. This promises an enhanced photoelectric conversion efficiency.

BRIEF DESCRIPTION OF THE DRAWINGS

FIGS. 3A to 3F are schematic sectional views showing manufacturing steps in a first embodiment of a solar cell manufacturing method according to the present invention, wherein
FIGS. 6A to 6F are schematic sectional views showing manufacturing steps in a second embodiment of the solar cell manufacturing method according to the present invention, wherein

DESCRIPTION OF THE PREFERRED EMBODIMENTS

Now, configurations of the method of manufacturing a solar cell and the solar cell according to the present invention will be described below.

First Embodiment

Figure 2:
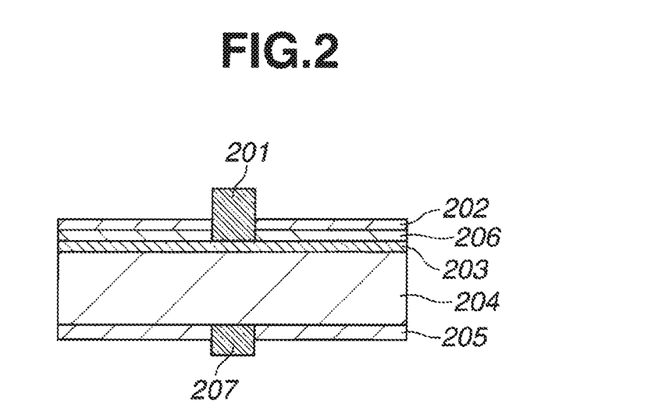
FIG. 2 is a sectional view showing a configuration example in a first embodiment of the solar cell according to the present invention.

FIG. 2 is a sectional view showing the configuration in a first embodiment of the solar cell according to the present invention, in the case where the semiconductor substrate is of the n type.

As shown in FIG. 2, the solar cell has a structure in which a p-type diffusion layer ($p^{+1}$ layer) 203, an $SiO_2$ film or aluminum oxide film 206, and an anti-reflection film 202 are sequentially provided in this order over a light-receiving surface (referred to also as "first principal surface") of an n-type semiconductor substrate 204. In addition, an SiNx film 205 is provided on a back surface (referred to also as "second principal surface" or "non-light-receiving surface"). Further, current collection electrodes 201 and 207 corresponding to positive and negative poles of the solar cell are provided respectively on the face and back sides of the n-type semiconductor substrate 204.

Here, the anti-reflection film 202 is composed of an SiNx film.

The solar cell having such a sectional structure as above-mentioned exhibits a high photoelectric conversion efficiency, since the SiNx film 205 and the $SiO_2$ or aluminum oxide film 206 function as passivation films on the back and face sides, respectively.

The solar cell configured as shown in FIG. 2 is manufactured, for example, by the steps shown in FIG. 3. Now, the steps will be described below referring to FIGS. 3A to 3F. Incidentally, in FIGS. 3A to 3F, layers corresponding to the components of the solar cell of FIG. 2 are denoted by the same reference signs as used in FIG. 2.

[Step 1]

Figure 3A:
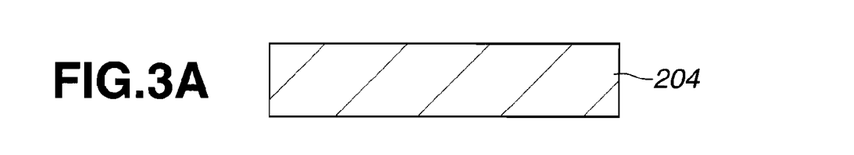
FIG. 3A shows an n-type semiconductor substrate preparing step.

An as-cut single-crystalline {100} n-type silicon substrate (hereinafter referred to simply as "substrate") 204 obtained by doping high-purity silicon with a Group V element such as arsenic or antimony and conditioned to have a resistivity of 0.1 to 5 Ω·cm has slicing damages on its surfaces. The slicing damages on the surfaces of the substrate are subjected to an etching treatment by use of a high-concentration alkali solution, such as sodium hydroxide or potassium hydroxide solution with a concentration of 5 to 60 wt %, or a mixed acid of hydrofluoric acid and nitric acid, or the like. The single-crystalline silicon substrate may be produced by any of a CZ method (Czochralski method) and an FZ method (floating zone method). Furthermore, a polycrystalline substrate may also be used, without any problem (FIG. 3A).

[Step 2]

Figure 3B:
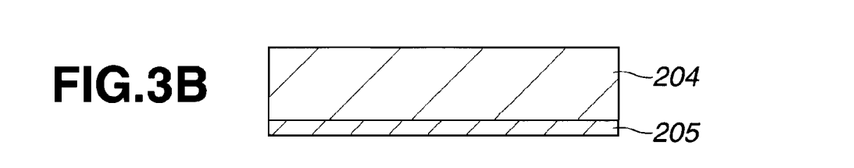
FIG. 3B shows an SiNx film forming step.

An SiNx film 205 is formed on the non-light-receiving surface (back surface) of the substrate 204 (FIG. 3B). The SiNx film 205 not only functions as a passivation film but also functions as a reflective film for reflection of incident light inside the substrate and as a diffusion mask and/or an oxidation mask in the subsequent steps.

The thickness of the SiNx film 205 is preferably 50 to 250 nm. When the thickness of the SiNx film 205 is below 50 nm, it may be impossible to obtain a passivation effect or a masking effect. If the thickness is more than 250 nm, on the other hand, the effect of the SiNx film as a reflective film for reflection of incident light inside the substrate may be lowered. Incidentally, the thickness of the SiNx film 205 and the like can be measured by an ellipsometer, an electron electroscope or the like. Furthermore, the film thickness can also be estimated to a certain extent by visual inspection of color tone.

In addition, the SiNx film 205 is formed by a CVD (chemical vapor deposition) method using a plasma enhanced CVD system or the like. As reactant gases in the CVD process, a mixture of monosilane ($SiH_4$) and ammonia ($NH_3$) is often used, but nitrogen can also be used in place of $NH_3$. Besides, the reactant gases may be admixed with hydrogen, for the purpose of controlling the process pressure and/or diluting the reactant gases, and for a further purpose of promoting the bulk passivation effect for the substrate 204 in the case where polycrystalline silicon is used as the substrate 204. As a method for excitation of the reactant gases in the CVD process, not only the above-mentioned plasma enhanced CVD but also thermal CVD, photo enhanced CVD and the like can be used.

After the formation of the SiNx film, formation of minute ruggedness called texture is preferably conducted. In this case, the protection by the SiNx film 205 prevents the texture from being formed on the back surface of the substrate 204. Therefore, the surface area of the back surface of the substrate 204 is smaller than in the case where the back surface is textured. This is effective in restraining photoelectric conversion characteristics from being lowered due to recombination.

The texture formation is an effective method for lowering the reflectance of the solar cell. The texture is produced by immersion of the substrate in a heated alkali solution (concentration: 1 to 10 wt %, temperature: 60 to 100° C.) of sodium hydroxide, potassium hydroxide, potassium carbonate, sodium carbonate, sodium hydrogen carbonate, or the like for about 10 to 30 minutes. A predetermined amount of 2-propanol is often dissolved in the alkali solution so as to accelerate the reaction. Incidentally, the texture formation may, if necessary, be carried out before the formation of the SiNx film.

[Step 3]

Figure 3C:
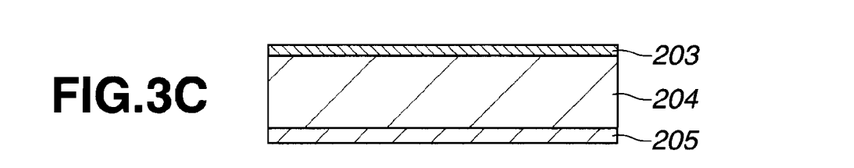
FIG. 3C shows a p-type diffusion layer forming step.

After the formation of the SiNx film 205, a p-type diffusion layer 203 is formed on the textured surface on the light-receiving surface side of the substrate 204 (FIG. 3C). The formation of the p-type diffusion layer 203 is conducted by use of a vapor phase diffusion method using $BBr_3$ as a diffusion source. Specifically, the flow rate of a carrier gas is so controlled that the concentration of $BBr_3$ will be 0.1 to 5 vol %, and, further, oxygen is also mixed in a similar concentration for forming a boron glass. In this gas atmosphere, a heat treatment is conducted at 850 to 1050° C. for 5 to 60 minutes. In this case, since the SiNx film 205 has been formed on the back side of the substrate 204, this film functions as a diffusion mask, whereby formation of a p-type diffusion layer on the back side is prevented.

Besides, the formation of the p-type diffusion layer 203 may also be performed by a method wherein a coating layer containing boron as a diffusion source is formed over the whole surface area of the substrate 204. Specifically, the coating layer is formed by brush coating, ink jet printing, screen printing, spin coating or the like, followed by a heat treatment conducted in conditions similar to the above-mentioned conditions, whereby the p-type diffusion layer 203 can be formed.

Subsequently, the glass formed on the surface of the substrate 204 having undergone the heat treatment for diffusion is removed by use of hydrofluoric acid or the like, followed by washing in an acidic aqueous solution of hydrochloric acid, sulfuric acid, nitric acid, or fluoronitric acid, or a mixture thereof. From the viewpoint of economy and efficiency, washing with a hydrochloric acid solution is preferred. For enhancing cleanliness, the washing may be conducted by admixing the hydrochloric acid solution with 0.5 to 5 wt % of hydrogen peroxide and heating at 60 to 90° C.

[Step 4]

Figure 3D:
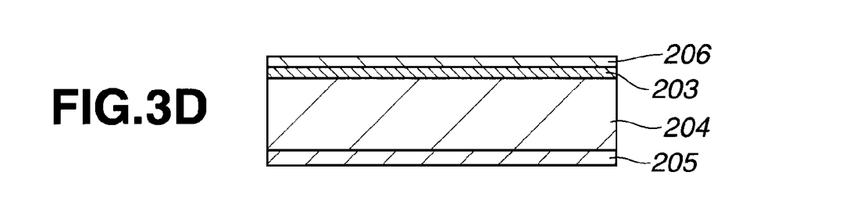
FIG. 3D shows an $SiO_2$ film or aluminum oxide film forming step.

An $SiO_2$ film or aluminum oxide film 206 is formed in a thickness of about 5 to 50 nm on the p-type diffusion layer 203 of the washed substrate (FIG. 3D). The $SiO_2$ film 206 can be formed by a thermal oxidation method, a CVD method, an oxide film coating method, or the like, among which the thermal oxidation method is preferred for obtaining excellent passivation characteristics. Specifically, the substrate 204 having undergone the treatments in Step 1 to Step 3 is placed in a furnace provided with an oxygen atmosphere at 700 to 1,000° C., and a heat treatment in this condition is conducted for 5 to 60 minutes, whereby a high-quality $SiO_2$ film is formed. In this instance, since the SiNx film 205 has been formed on the back side of the substrate 204, formation of an $SiO_2$ film on the back side can be prevented.

On the other hand, the aluminum oxide film 206 can be formed, for example, by a vapor deposition method, a sputtering method, a CVD method, or the like. Particularly, an ALD (atomic layer deposition) method, which is one of CVD methods, is preferred because excellent passivation characteristics can be obtained thereby. While the ALD method is thus preferable, it is disadvantageous in that the covering efficiency is so high that turning-around of material to other areas than the desired film formation surface would occur to a very high extent. In the present invention, however, the SiNx film 205 formed on the back side of the substrate 204 can prevent formation of an aluminum oxide film on the back side.

[Step 5]

Figure 3E:
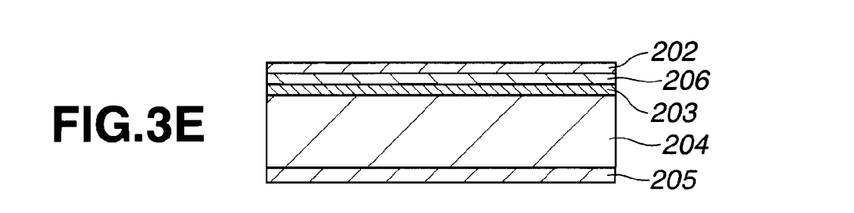
FIG. 3E shows an anti-reflection film forming step.

Next, an anti-reflection film 202 is formed on the $SiO_2$ film or aluminum oxide film 206 on the light-receiving surface side of the substrate 204 (FIG. 3E). Here, like in the case of forming the SiNx film 205 on the back side, a plasma enhanced CVD system is used to form an SiNx film or the like as the anti-reflection film 202 in a thickness of 50 to 80 nm.

[Step 6]

Figure 3F:
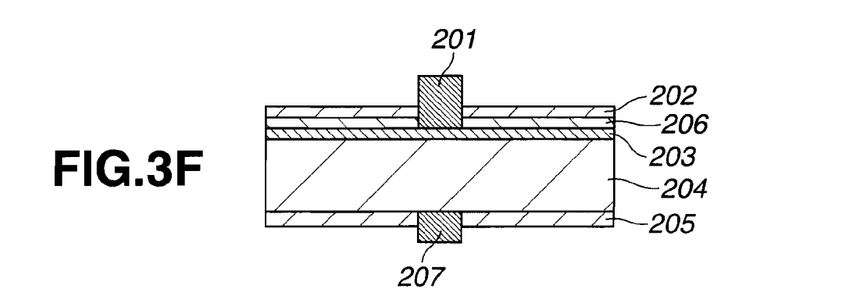
FIG. 3F shows an electrode forming step.

Subsequently, a current collection electrode 207 is formed on the back side of the substrate 204, with the SiNx film 205 therebetween, and a current collection electrode 201 is formed on the light-receiving surface side, with the anti-reflection film 202, $SiO_2$ film or aluminum oxide film 206 therebetween (FIG. 3F). The current collection electrodes 201 and 207 may be formed, for example, by a vapor deposition method, a sputtering method, a printing method or the like. Among these methods, preferred from the economic point of view are printing methods such as ink jet printing and screen printing. Specifically, onto the back surface side and the light-receiving surface side of the substrate 204 having been subjected to the treatments in Steps 1 to 5, a conductive paste prepared by dispersing particulates of a metal such as Ag in an organic solvent is applied by printing in electrode patterns, followed by drying. As for the shapes of the electrode patterns, it is preferable for the current collection electrode 201 on the light-receiving surface side to be formed in a comb tooth shape. On the other hand, the current collection electrode 207 on the back surface side can have any of various shapes; for example, the current collection electrode 207 may be formed to cover the whole area of the substrate back surface, or may be formed in the same comb tooth shape as the current collection electrode 201 on the light-receiving surface side, or may be formed in a grid shape. The printing is followed by a heat treatment at around 600 to 900° C., thereby sintering the Ag and causing the silver particles to penetrate (fire-through) the anti-reflection film 202, the SiNx film 205, and the $SiO_2$ film or aluminum oxide film 206, whereby conduction between the electrodes and the silicon constituting the substrate 204 is established. Incidentally, the current collection electrodes 201 and 207 may be sintered separately or may be sintered simultaneously.

According to the manufacturing method of the present invention as above-described, it is possible to manufacture a solar cell having the SiNx film 205 and the $SiO_2$ film or aluminum oxide film 206, which serve as appropriate passivation films, respectively on the back and face sides of the substrate 204 as shown in FIG. 2; also, it is possible to attain an enhanced photoelectric conversion efficiency. In addition, the SiNx film 205, which finally becomes a passivation film, is formed at an early stage of the manufacturing process. Therefore, the SiNx film 205 can serve as a treatment mask during the texture formation conducted later. This makes it possible to restrain the photoelectric conversion characteristics of the solar cell completed from being lowered due to recombination. Also, the SiNx film 205 serves as a diffusion mask during the formation of the p-type diffusion layer in Step 3. Besides, the SiNx film 205 serves as an oxidation mask during the formation of the $SiO_2$ film or aluminum oxide film 206 in Step 4. This ensures that the solar cell can be fabricated easily.

Figure 4:
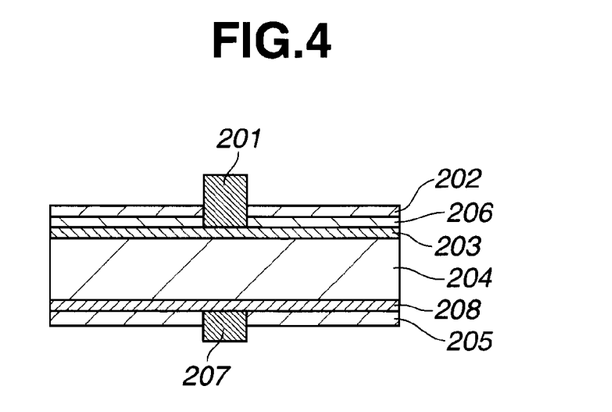
FIG. 4 is a sectional view showing a modification of the configuration in the first embodiment of the solar cell according to the present invention.

Incidentally, in the method of manufacturing a solar cell according to this embodiment, an $n^+$-type diffusion layer 208 may be formed on the side (back side) opposite to the light-receiving surface of the substrate 204 before Step 2, and then the treatments in Step 2 and the subsequent steps may be conducted. As a result, there can be obtained a solar cell having a high photoelectric conversion efficiency, wherein the p-type diffusion layer 203 is provided on the light-receiving surface side of the n-type semiconductor substrate 204, and the $n^+$-type diffusion layer 208 is provided on the back side, as shown in FIG. 4.

Second Embodiment

Figure 5:
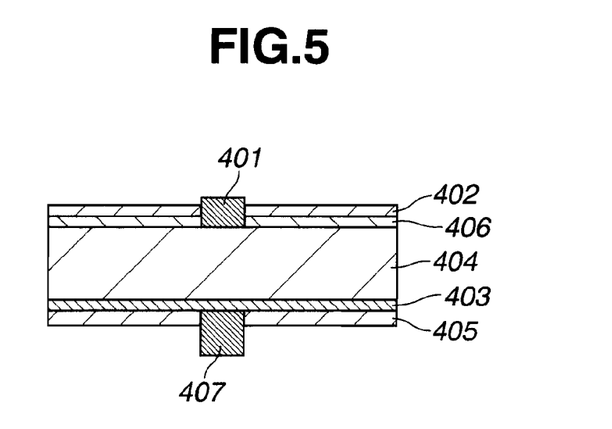
FIG. 5 is a sectional view showing a configuration example in a second embodiment of the solar cell according to the present invention.

FIG. 5 is a sectional view showing the configuration of a second embodiment of the solar cell according to the present invention, representing the case where the semiconductor substrate is of the p type.

As shown in FIG. 5, an $SiO_2$ film or aluminum oxide film 406 and an anti-reflection film 402 are stacked in this order on a light-receiving surface (referred to also as "first principal surface") of a p-type semiconductor substrate 404. In addition, an n-type diffusion layer ($n^+$ layer) 403 and an SiNx film 405 are provided on the back surface (referred to also as "second principal surface" or "non-light-receiving surface") of the p-type semiconductor substrate 404. Furthermore, current collection electrodes 401 and 407 corresponding to positive and negative poles of a solar cell are provided respectively on the face and back sides of the p-type semiconductor substrate 404.

Here, the anti-reflection film 402 is composed of an SiNx film.

In the solar cell having the sectional structure as above-mentioned, the SiNx film 405 and the $SiO_2$ film or aluminum oxide film 406 function as passivation films on the back side and the face side, respectively. Therefore, the solar cell shows a high photoelectric conversion efficiency.

The solar cell configured as shown in FIG. 5 is manufactured, for example, by steps shown in FIGS. 6A to 6F. Now, the steps will be described below referring to FIGS. 6A to 6F, wherein layers corresponding to those in the solar cell shown in FIG. 5 are denoted by the same reference signs as used in FIG. 5.

[Step i]

Figure 6A:
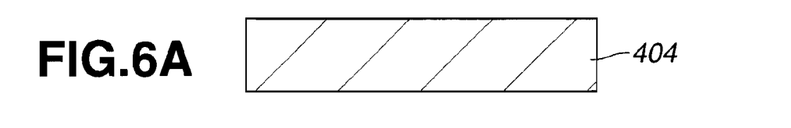
FIG. 6A shows a p-type semiconductor substrate preparing step.

Slicing damages on an as-cut p-type semiconductor substrate (hereinafter referred to as "substrate") 404 are removed by chemical etching. Specifically, the substrate 404 is subjected to an etching treatment using a high-concentration alkali solution such as a 5 to 60 wt % solution of sodium hydroxide or potassium hydroxide, a mixed solution of hydrofluoric acid and nitric acid, or the like (FIG. 6A).

[Step ii]

Figure 6B:
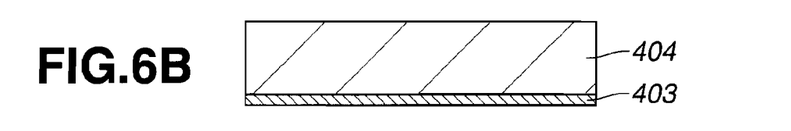
FIG. 6B shows an n-type diffusion layer forming step.

Next, an n-type diffusion layer 403 is formed on the side (back side) opposite to the light-receiving surface of the substrate 404 (FIG. 6B). The n-type diffusion layer 403 is formed by a vapor phase diffusion method with phosphorus oxychloride as a diffusion source. Specifically, the flow rate of a carrier gas is so controlled that the phosphorus oxychloride concentration will be 0.1 to 5 vol %, and, further, oxygen is also mixed in a similar quantity for formation of a phosphorus glass. In this gas atmosphere, a heat treatment is conducted at 750 to 950° C. for 5 to 60 minutes. In this case, two sheets of the substrates 404 may be subjected to the heat treatment in a stacked state with their face sides in contact with each other, whereby the n-type diffusion layers 403 can be formed only on the back sides of the two sheets of the substrates 404.

The n-type diffusion layer 403 may be formed by a coating method in which a coating layer, with phosphorus as a diffusion source, is provided on the whole area of the substrate surface. Specifically, the coating layer is formed by brush coating, ink jet printing, screen printing, spin coating or the like, followed by a heat treatment in the same conditions as above-mentioned, whereby the n-type diffusion layer 403 can be formed. Incidentally, the phosphorus glass formed is removed by use of hydrofluoric acid or the like, after which the glass formed on the surface of the substrate 404 having been subjected to the heat treatment for diffusion is removed by hydrofluoric acid or the like.

[Step iii]

Figure 6C:
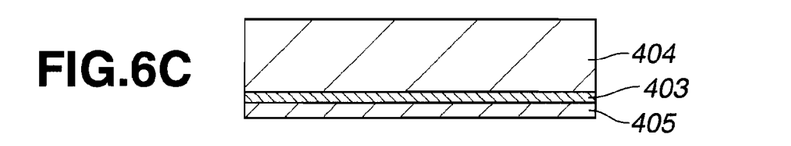
FIG. 6C shows an SiNx film forming step.

An SiNx film 405 is formed on the n-type diffusion layer 403 by a plasma enhanced CVD method or the like (FIG. 6C). The SiNx film 405 not only functions as a passivation film but also functions as a reflective film for reflecting incident light inside the substrate and as a diffusion mask and/or an oxidation mask in the steps to be conducted later.

The thickness of the SiNx film 405 is preferably 50 to 250 nm. If the thickness of the SiNx film 405 is less than 50 nm, it may be impossible to obtain a passivation effect or a masking effect. When the thickness is more than 250 nm, on the other hand, the effect of the SiNx film 405 as the above-mentioned reflective film for reflection of incident light inside the substrate may be lowered.

After the formation of the SiNx film 405, formation of minute ruggedness called texture is preferably carried out. In this case, not only the formation of texture on the back side of the substrate 404 can be prevented, but also an n-type diffusion layer, which would be unintendedly formed in a considerable extent on the light-receiving surface in Step ii, can be removed while protecting the n-type diffusion layer 403 on the back side by the SiNx film 405. Therefore, this procedure is extremely effective in obtaining high photoelectric conversion characteristics.

The texture formation is carried out by immersion of the substrate 404 in a heated alkali solution (concentration: 1 to 10 wt %, temperature: 60 to 100° C.) of sodium hydroxide, potassium hydroxide, potassium carbonate, sodium carbonate, sodium hydrogen carbonate or the like for about 10 to 30 minutes. In many cases, the reaction in this treatment is accelerated by dissolving a predetermined amount of 2-propanol in the alkali solution. Incidentally, the texture formation may, if necessary, be conducted before the formation of the n-diffusion layer 403.

Next, the substrate 404 is washed in an acidic aqueous solution of hydrochloric acid, sulfuric acid, nitric acid, or hydrofluoric acid, or a mixed solution thereof. Among these acidic aqueous solutions, preferred from the viewpoints of economy and efficiency is a hydrochloric acid solution. For enhancing cleanliness, the washing may be conducted by admixing the hydrochloric acid solution with 0.5 to 5 wt % of hydrogen peroxide and heating at 60 to 90° C.

[Step iv]

Figure 6D:
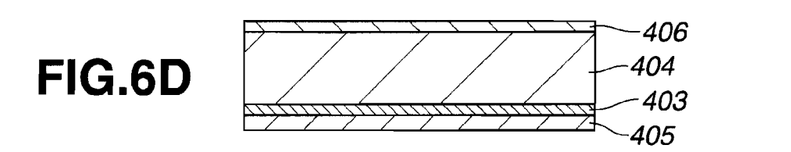
FIG. 6D shows an $SiO_2$ film or aluminum oxide film forming step.

Subsequently, an $SiO_2$ film or aluminum oxide film 406 having a thickness of 10 to 50 nm is formed on the light-receiving surface of the substrate 404 (FIG. 6D). The $SiO_2$ film 406 can be formed by a thermal oxidation method, a CVD method, an oxide film coating method, or the like. Among these methods, the thermal oxidation method is preferred, for obtaining excellent passivation characteristics. Specifically, the substrate 404 having been subjected to the treatments of Steps i to iii is placed in a furnace provided with an oxygen atmosphere at 700 to 1,000° C., and a heat treatment is conducted for 5 to 60 minutes, whereby a high-quality $SiO_2$ film is formed. In this case, formation of an $SiO_2$ film on the back side of the substrate 404 can be prevented, since the SiNx film 405 has been formed on the back side. On the other hand, the aluminum oxide film 406 can be formed, for example, by a vapor deposition method, a sputtering method, a CVD method or the like. Especially, an ALD method is preferred because excellent passivation characteristics can be obtained thereby. In the present invention, since the SiNx film 405 is formed on the back side of the substrate 404, formation of an aluminum oxide film on the back side can be prevented.

[Step v]

Figure 6E:
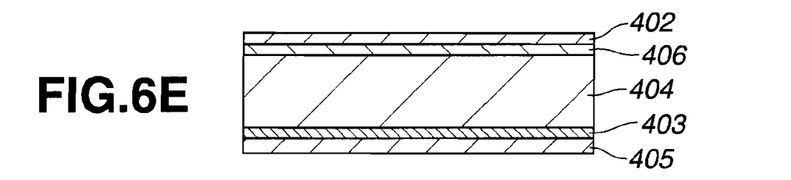
FIG. 6E shows an anti-reflection film forming step.

Next, an anti-reflection film 402 is formed on the $SiO_2$ film or aluminum oxide film 406 on the light-receiving surface side of the substrate 404 (FIG. 6E). Here, an SiNx film is formed in a thickness of 50 to 80 nm as the anti-reflection film 402, by use of a plasma enhanced CVD system or the like, like in the case of the SiNx film 405 on the back side.

[Step vi]

Figure 6F:
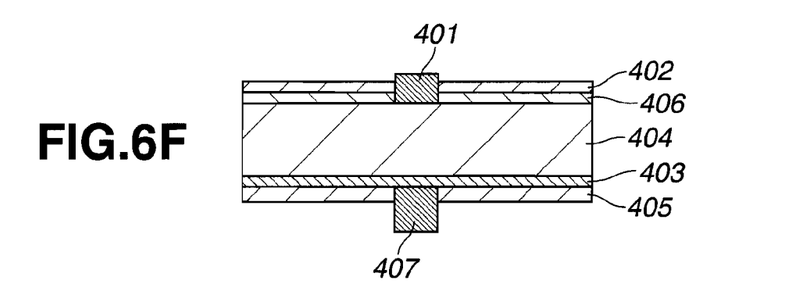
FIG. 6F shows an electrode forming step.

Finally, a current collection electrode 407 is formed on the back side of the substrate 404, with the SiNx film 405 therebetween, and a current collection electrode 401 is formed on the light-receiving surface side, with the anti-reflection film 402 and the $SiO_2$ film or aluminum oxide film 406 therebetween (FIG. 6F). The current collection electrodes 401 and 407 can be formed by a vapor deposition method, a sputtering method, a printing method, or the like.

According to the manufacturing method of the present invention as above-described, it is possible to manufacture a solar cell having the SiNx film 405 and the $SiO_2$ film or aluminum oxide film 406, which serve as appropriate passivation films, respectively on the back and face sides of the substrate 404 as shown in FIG. 5; also, it is possible to obtain an enhanced photoelectric conversion efficiency. Besides, the SiNx film 405, which finally becomes a passivation film, is formed at an early stage of the manufacturing process. Therefore, the SiNx film 405 can serve as a treatment mask during the texture formation conducted later. This makes it possible to restrain the photoelectric conversion characteristics of the solar cell completed from being lowered due to recombination. Besides, the SiNx film 405 serves as an oxidation mask during the formation of the $SiO_2$ film or aluminum oxide film 406 in Step iv. This ensures that the solar cell can be produced easily.

Figure 7:
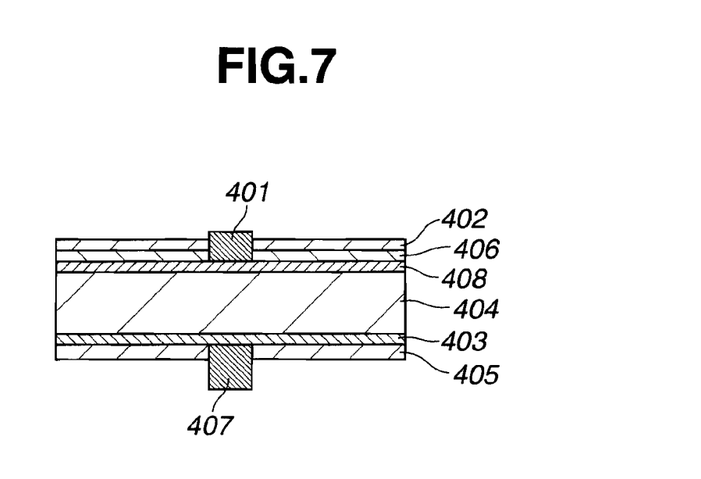
FIG. 7 is a sectional view showing a modification of the configuration in the second embodiment of the solar cell according to the present invention.

Incidentally, in the method of manufacturing a solar cell according to this embodiment, a $p^+$-type diffusion layer 408 may be formed on the light-receiving surface side of the substrate 404 before Step iv, and then the treatments in Steps iv and the subsequent steps may be carried out. As a result, there can be obtained a solar cell having a high photoelectric conversion efficiency, wherein the $p^+$-type diffusion layer 408 is provided on the light-receiving surface side of the p-type semiconductor substrate 404, and the n-type diffusion layer 403 is provided on the back side, as shown in FIG. 7.

EXAMPLE

Now, an Example of the present invention will be described below. It should be noted, however, that the present invention is not restricted to the Example.

Example 1

For confirming the effectiveness of the present invention, a solar cell having a sectional structure shown in FIG. 2 was fabricated in the following Condition A and put to evaluation.

(Fabrication Procedure and Conditions)

First, as semiconductor substrate, six sheets of phosphorus-doped {100} n-type as-cut silicon substrates measuring 100 mm×100 mm, 250 μm in thickness, and having a resistivity of 1 Ω·cm were prepared. Damaged layers of the silicon substrates were removed by use of a heated aqueous solution of potassium hydroxide.

Next, an SiNx film 205 was formed on only one side of each of the silicon substrates by a plasma enhanced CVD method. In this case, a mixed gas of monosilane and ammonia was used as a reactant gas, the film thickness was 150 nm, and the refractive index was 2.1. Then, the substrates were subjected to texture formation by immersing them in an aqueous solution containing potassium hydroxide and 2-propanol. In this case, the SiNx film served as a mask, so that each of the substrates was textured only on the side opposite to the side on which the SiNx film had been formed.

Next, formation of a p-type diffusion layer 203 was conducted. Specifically, a pair of the silicon substrates were stacked on each other with their back sides in contact, then three such pairs were placed in a gas atmosphere obtained by admixing nitrogen with 0.8 vol % of $BBr_3$ and 0.8 vol % of oxygen, and a heat treatment was conducted at 1,000° C. for 15 minutes. Subsequently, boron glass formed on the surfaces of the silicon substrates were removed by use of hydrofluoric acid. In this instance, the silicon substrates showed a sheet resistance of 43 Ω.

Next, the silicon substrates were subjected to thermal oxidation by treating them in an oxygen atmosphere at 1,000° C. for ten minutes. By this treatment, a thermal oxide film ($SiO_2$ film) 206 was formed on the side opposite to the side on which the SiNx film 205 had been formed, of each of the silicon substrates.

Subsequently, an anti-reflection film 202 composed of an SiNx film was formed on the $SiO_2$ film 206. In this case, also, a plasma enhanced CVD method was used, with the film thickness being 75 nm and the refractive index being 2.1.

Finally, a Ag paste was applied to the back side and the light-receiving side of each silicon substrate in a comb tooth-shaped pattern by screen printing, followed by drying. The Ag paste was a paste prepared by dispersing Ag particulates having a particle diameter of several nanometers to several tens of nanometers in an organic solvent. Thereafter, the silicon substrates having undergone the above-mentioned treatments were heat treated at 750° C. in an air atmosphere for about ten seconds to sinter the Ag particulates, thereby completing solar cells.

Comparative Example 1

For comparison, a solar cell according to the related art was fabricated in the following Condition B and put to evaluation.
(Fabrication Procedure and Conditions)

First, as semiconductor substrate, six sheets of phosphorus-doped {100} n-type as-cut silicon substrates measuring 100 mm×100 mm, 250 μm in thickness, and having a resistivity of 1 Ω·cm were prepared. Damaged layers of the silicon substrates were removed by use of a heated aqueous solution of potassium hydroxide.

Next, the silicon substrates were subjected to texture formation by immersing them in an aqueous solution containing potassium hydroxide and 2-propanol.

Subsequently, formation of a p-type diffusion layer was conducted in the same conditions as in Example 1.

Next, the silicon substrates were subjected to thermal oxidation by treating them in an oxygen atmosphere at 1,000° C. for ten minutes. By this treatment, thermal oxide films ($SiO_2$ films) were formed on both sides of each silicon substrate.

Subsequently, anti-reflection films each composed of an SiNx film were formed respectively on the thermal oxide films on both sides of each silicon substrate. In this case, also, a plasma enhanced CVD method was used, with the film thickness being 75 nm and the refractive index being 2.1.

Finally, the same Ag paste as that in Example 1 was applied to the back side and the light-receiving side of each silicon substrate in a comb tooth-shaped pattern by screen printing, followed by drying. Thereafter, the silicon substrates having undergone the above-mentioned treatments were heat treated at 750° C. in an air atmosphere for about ten seconds to sinter the Ag particulates, thereby completing solar cells.
(Evaluation Method)

The solar cell samples obtained as above-mentioned were subjected to measurement of solar cell characteristics by use of a solar simulator made by Yamashita Denso Corporation under the conditions of an AM 1.5 spectrum, an illumination intensity of 100 mW/cm² and a temperature of 25° C. Mean values of the measurement results are set forth in Table 1 below.

TABLE 1

| | Condition | Short-circuit current (A) | Open-circuit voltage (V) | Fill factor (%) | Maximum output (W) |
|---|---|---|---|---|---|
| Example 1 | A | 3.81 | 0.648 | 78.2 | 1.93 |
| Comparative Example 1 | B | 3.76 | 0.641 | 78.4 | 1.89 |

From the above results, it is found that the solar cells fabricated in Example 1 show a largely increased open-circuit voltage and an increased maximum output, as compared with the solar cells fabricated in Comparative Example 1. This is considered to be attributable to the solar cell structure in Example 1 wherein the back side of the silicon substrate was inactivated directly with the SiNx film 205 and, further, formation of texture on the back side of the silicon substrate was obviated by the presence of the SiNx film 205. In addition, these effects of the solar cells according to the present invention were obtained without increasing the number of manufacturing steps.

Japanese Patent Application No. 2012-027297 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A method of manufacturing a solar cell comprising
an n-type semiconductor substrate having a texture only on a light-receiving surface;
a first passivation film composed of an silicon nitride film formed over a back surface of the n-type semiconductor substrate;
a p-type diffusion layer formed over the light-receiving surface of the n-type semiconductor substrate;
a second passivation film formed over the p-type diffusion layer and composed of an aluminum oxide film;
an anti-reflection film formed on the second passivation film; and
current extraction electrodes formed on the light-receiving surface side and the back side of the substrate,
comprising steps of:
  (i) forming the silicon nitride film having a thickness of 150 to 250nm over the back surface of the n-type semiconductor substrate;
  (ii) forming the texture on the light-receiving surface of the n-type semiconductor substrate by immersion of the substrate in a heated alkali solution;
  (iii) forming the p-type diffusion layer over the light-receiving surface of the n-type semiconductor substrate after step (ii), and subsequently removing the boron glass formed on the surface of the n-type semiconductor substrate by use of hydrofluoric acid;
  (iv) then forming over the p-type diffusion layer the second passivation film composed of an aluminum oxide film by an atomic layer deposition method;
  (v) forming the anti-reflection film over the second passivation film; and

(vi) forming the current extraction electrodes on the light-receiving surface side and the back side of the substrate, wherein the silicon nitride film serves as a treatment mask during the texture formation in step (ii), as a diffusion mask during the formation of the p-type diffusion layer in step (iii), as an oxidation mask during the formation of the aluminum oxide film in step (iv) and as the first passivation film on the back surface of the substrate of the solar cell, and wherein said step of forming current extraction electrodes comprises a step of printing a conductive paste on the silicon nitride film of the back surface side of the substrate, and firing the paste at 600 to 900° C. to sinter the conductive paste and cause it to fire through the silicon nitride film of the back surface side of the substrate to make electrical contact between the current extraction electrode and the substrate.

2. The method according to claim 1, wherein a thickness of the second passivation film is 10 to 50 nm, and a thickness of the anti-reflection film is 50 to 80 nm.

3. The method according to claim 1, wherein said step of forming current extraction electrodes comprises a step of printing a conductive paste on the anti-reflection film of the light-receiving surface side and the silicon nitride film of the back surface side of the substrate, respectively, and firing the paste at 600 to 900° C. to sinter the conductive paste on the anti-reflection film of the light-receiving surface side and the silicon nitride film of the back surface side of the substrate simultaneously and cause it to fire through the anti-reflection film and the second passivation film of the light-receiving surface side and the silicon nitride film of the back surface side of the substrate to make electrical contact between the current extraction electrodes and the substrate, respectively.

4. The method according to claim 1, wherein the conductive paste is a silver paste.

5. The method according to claim 1 wherein the silicon nitride film serves as a reflective film for reflection of incident light inside the substrate of the solar cell.

* * * * *